US012598960B2

(12) United States Patent
Zhang et al.

(10) Patent No.: US 12,598,960 B2
(45) Date of Patent: Apr. 7, 2026

(54) DISPLAY PANEL, PREPARATION METHOD FOR DISPLAY PANEL, AND DISPLAY DEVICE

(71) Applicants: MIANYANG HKC OPTOELECTRONICS TECHNOLOGY CO., LTD., Mianyang (CN); HKC CORPORATION LIMITED, Shenzhen (CN)

(72) Inventors: Jianying Zhang, Mianyang (CN); Haijiang Yuan, Mianyang (CN)

(73) Assignees: MIANYANG HKC OPTOELECTRONICS TECHNOLOGY CO., LTD., Mianyang (CN); HKC CORPORATION LIMITED, Shenzhen (CN)

( * ) Notice: Subject to any disclaimer, the term of this patent is extended or adjusted under 35 U.S.C. 154(b) by 605 days.

(21) Appl. No.: 18/065,874

(22) Filed: Dec. 14, 2022

(65) Prior Publication Data

US 2023/0420311 A1 Dec. 28, 2023

(30) Foreign Application Priority Data

Jun. 27, 2022 (CN) .......................... 202210733594.1

(51) Int. Cl.
*H01L 21/66* (2006.01)
*G02F 1/13* (2006.01)
(Continued)

(52) U.S. Cl.
CPC ............ *H01L 22/30* (2013.01); *G02F 1/1309* (2013.01); *H01L 22/12* (2013.01); *H10N 30/02* (2023.02);
(Continued)

(58) Field of Classification Search
CPC ............. G02F 1/1309; G02F 1/133394; G02F 2201/44; G02F 1/136254; G02F 2203/69
See application file for complete search history.

(56) References Cited

U.S. PATENT DOCUMENTS

2002/0011111 A1 1/2002 Otsuchi et al.
2017/0090655 A1* 3/2017 Zhang ................... G06F 3/0412
(Continued)

FOREIGN PATENT DOCUMENTS

CN 101458134 A 6/2009
CN 102598106 A 7/2012
(Continued)

OTHER PUBLICATIONS

Office Action issued on Aug. 19, 2024, in corresponding Korean Application No. 10-2023-7028692, 12 pages.
(Continued)

*Primary Examiner* — Paisley L Wilson
(74) *Attorney, Agent, or Firm* — Maier & Maier, PLLC

(57) ABSTRACT

A display panel and a preparation method thereof, and a display device. The display panel includes a display main body, which includes a display area and an encapsulation area, and the display panel further has deformation detection elements, including: an electro-display module having one or more electro-display units, and a piezoelectric module positioned on a surface of at least one deformable functional layer in the display main body, and positioned in the encapsulation area. The piezoelectric module includes two or more piezoelectric units disposed at intervals on the surface of the deformable functional layer, and a voltage difference is applied between two adjacent piezoelectric units. An electro-display unit is connected in series between the two adjacent piezoelectric units. The display panel can detect in real time whether deformation occurs through the (Continued)

deformation detection means, thereby ensuring the encapsulation quality and display effect.

17 Claims, 3 Drawing Sheets

(51) Int. Cl.

| | |
|---|---|
| *H10N 30/02* | (2023.01) |
| *H10N 30/30* | (2023.01) |
| *H10N 39/00* | (2023.01) |
| *G02F 1/1333* | (2006.01) |
| *G02F 1/1341* | (2006.01) |
| *G02F 1/163* | (2006.01) |
| *H10N 30/853* | (2023.01) |
| *H10N 30/857* | (2023.01) |

(52) U.S. Cl.
CPC ........... *H10N 30/302* (2023.02); *H10N 39/00* (2023.02); *G02F 1/133394* (2021.01); *G02F 1/1341* (2013.01); *G02F 1/163* (2013.01); *G02F 2201/44* (2013.01); *H10N 30/853* (2023.02); *H10N 30/8542* (2023.02); *H10N 30/8548* (2023.02); *H10N 30/857* (2023.02)

(56) References Cited

U.S. PATENT DOCUMENTS

| | | | |
|---|---|---|---|
| 2019/0243493 A1 | 8/2019 | Ding et al. | |
| 2020/0126488 A1 | 4/2020 | Ouyang et al. | |
| 2021/0225961 A1* | 7/2021 | Sun .......................... | G09F 9/30 |
| 2021/0305487 A1 | 9/2021 | Li et al. | |
| 2021/0356345 A1 | 11/2021 | Li | |
| 2021/0376012 A1 | 12/2021 | Li et al. | |

FOREIGN PATENT DOCUMENTS

| | | | |
|---|---|---|---|
| CN | 103229229 A | 7/2013 | |
| CN | 103514826 A | 1/2014 | |
| CN | 105824468 A | 8/2016 | |
| CN | 108534930 A | 9/2018 | |
| CN | 109461415 A | 3/2019 | |
| CN | 109557729 A | 4/2019 | |
| CN | 109923676 A | 6/2019 | |
| CN | 209181941 U | 7/2019 | |
| CN | 110277429 A | 9/2019 | |
| CN | 110752783 A | 2/2020 | |
| CN | 110953981 A | 4/2020 | |
| CN | 111029484 A | 4/2020 | |
| CN | 112485950 A | 3/2021 | |
| CN | 214474891 U | 10/2021 | |
| CN | 115047657 A | 9/2022 | |
| JP | 2001210101 A | 8/2001 | |
| JP | 2002063801 A | 2/2002 | |
| JP | 2018012808 A | 1/2018 | |
| WO | 2019179079 A1 | 9/2019 | |
| WO | 2020066157 A1 | 4/2020 | |

OTHER PUBLICATIONS

Office Action issued on Oct. 1, 2024, in corresponding Japanese Application No. 2023-553022, 4 pages.
Office Action issued on May 15, 2023, in corresponding Chinese Application No. 202210733594.1, 8 pages.

* cited by examiner

DISPLAY PANEL, PREPARATION METHOD FOR DISPLAY PANEL, AND DISPLAY DEVICE

CROSS-REFERENCE TO RELATED APPLICATIONS

This application claims the benefit of Chinese patent application No. 202210733594.1 filed on Jun. 27, 2022, the contents of which are incorporated herein by reference.

TECHNICAL FIELD

The present application relates to the technical field of light leakage detection, and in particular, to a display panel, a preparation method thereof, and a display device.

BACKGROUND

Display screens are an important part of many electronic devices, especially high-definition TVs and medical display devices, which requires higher quality display screens. For example, in the existing active displays, the display panel and the backlight source are usually assembled together with the back-adhesive on the edge of the backlight.

In order to ensure the quality of a display screen, it is necessary to test various indicators of the display screen before being dispatching from the factory. While the existing electronic devices with a display screen is prone to deformation at the edge of the display screen when subjected to external pressure, as a result of the design of the liquid crystal display screen and the backlight module in the display screen itself, as well as the complex process, such as the assembly of the structural components, and the bonding of the touch screen. This hence results in light leakage from the edge of the display screen. therefore, the detection of any light leakage of the display screen is one of the important steps in the display screen detection.

In the conventional technology, the detection of screen light leakage is usually performed by displaying a black image on the screen of an electronic device, and detecting whether the screen has light leakage and the degree of light leakage through a sensor according to the display effect on the edge of the display screen. In a common test method, an acquisition end of the sensor, usually a probe, is fitted closely to the screen to take the measurements, and then the collected data is processed to determine whether the light leakage of the display screen meets the requirements. However, the existing detection method is significantly affected by the probe size and performance of the measurement equipment of the sensor. For example, if the probe size is fixed, and the data collecting range of the probe is in a circular or spherical shape, there will be a problem that although the test data results meet the indicators, but there is a serious local light leakage, thereby resulting in inaccurate detection, especially when the light leakage occurs at the edge of the screen, or when the testing area is larger than the area of the point of light leakage.

Moreover, if the light leakage is caused by deformation, it is also difficult to determine whether the leakage is caused by deformation or encapsulation through the existing detection methods. That is, when there is deformation at the edge of the display screen causing light leakage at the edge, such deformation cannot be detected during the assembly process, but only after the assembly, and the detection may be inaccurate, resulting in the deformed display screen impossible or difficult to return for repairing.

SUMMARY

The present application provides a display panel and a preparation method for the display panel, in order to overcome the problems in the existing technologies and to provide an effective and timely detection and determination that whether a display panel is deformed during and after encapsulation, so as to improve the encapsulation quality and display quality of the display panel, which solves the problem that deformation in the existing display panels cannot be timely detected during encapsulation, leading to a high repair rate.

The present application also provides a display device, in order to solve the problem of low encapsulation quality and unsatisfactory display effect of the existing display devices.

In a first aspect of the present application, a display panel includes a display main body including a display area and an encapsulation area; and a deformation detection means, and the deformation detection means includes:

an electro-display module, including one or more electro-display units;

a piezoelectric module, arranged on a surface of at least one deformable functional layer in the display main body, and positioned in the encapsulation area; where the piezoelectric module includes at least one first piezoelectric unit and at least one second piezoelectric unit, and a voltage difference being applied between the first piezoelectric unit and the second piezoelectric unit; the first piezoelectric unit and the second piezoelectric unit disposed on the surface of a same deformable functional layer are alternately disposed and spaced apart from each other; two adjacent piezoelectric units are connected in series by an electro-display unit therebetween, and the spacing between the two adjacent piezoelectric units is such that when the deformable functional layer is deformed, the two adjacent piezoelectric units can contact each other to generate a pressure signal which is converted into an electrical signal, and the electrical signal excites the electro-display unit that is connected in series between the adjacent first piezoelectric unit and the adjacent second piezoelectric unit to display.

In a second aspect of the present application, provided is a preparation method for the deformation detection means, which includes following steps:

arranging a piezoelectric module on a surface of at least one deformable functional layer in a display main body, such that the piezoelectric module is positioned in an encapsulation area on the deformable functional layer; where the piezoelectric module includes at least one first piezoelectric unit and at least one second piezoelectric unit, and a voltage difference being applied between the first piezoelectric unit and the second piezoelectric unit; the first piezoelectric unit and the second piezoelectric unit are alternately disposed at intervals on a surface of the same deformable functional layer; and a spacing between the first piezoelectric unit and an adjacent second piezoelectric unit is such that when the deformable functional layer is deformed, the first piezoelectric unit and the adjacent second piezoelectric unit is able to contact each other to generate a pressure signal which is converted into an electrical signal;

connecting an electro-display unit in series between the first piezoelectric unit and the adjacent second piezoelectric unit for display under excitation of the electrical signal.

carrying out encapsulation process for the deformable functional layer having the piezoelectric module arranged thereon and other functional parts in the display main body, monitoring a display result of the electro-display unit, and adjusting conditions of the encapsulation process according to the display result.

In a third aspect of the present application, provided is a display device. The display device of the present application includes the display panel of the present application, or a display panel prepared by the encapsulation method for the display device of the present application.

Compared to the existing technologies, the present application has following advantageous effects:

The display panel of the present application includes a deformation detection means arranged in the encapsulation area of at least one deformable functional layer in the display main body, and a plurality of piezoelectric units of the deformation detection means are disposed and spaced apart on the deformable functional layer. By controlling the voltage difference and the spacing between two adjacent piezoelectric units on the same deformable functional layer, when the deformable functional layer is deformed, the two adjacent piezoelectric units with the voltage difference contact each other and generates a pressure signal, which is converted into an electrical signal by the piezoelectric units. The electrical signal is transmitted to the electro-display unit connected in series between the two adjacent piezoelectric units and the electro-display unit is excited to display. According to the display signal, it is possible to directly and timely determine whether the deformable functional layer is deformed, so that the encapsulation of the display panel can be controlled or adjusted in time, or the cause of such as light leakage of the display panel can be directly determined, thereby ensuring the encapsulation quality and the display effect, or the repair efficiency of the display panel.

The encapsulation method of the present application effectively provides a plurality of piezoelectric units disposed at intervals on the deformable functional layer, and connects an electro-display unit with the first piezoelectric unit and the adjacent second piezoelectric unit in series. When the deformable functional layer is deformed, the piezoelectric units generate an electrical signal, which can excite the electro-display unit to display, so that the display panel can be detected and monitored in real time whether a deformation occurs in the display panel during the encapsulation process, preventing the occurrence of undesirable phenomena such as light leakage and poor encapsulation quality after the encapsulation process. Thus, the encapsulation quality of the display panel can be guaranteed, the yield rate and encapsulation quality of the display panel can be enhanced, and the display effect of the display panel can be improved, at the same time, the repair rate of the display panel can be reduced, and the high efficiency also lowers the encapsulation cost.

Since the display device of the present application includes the display panel of the present application, therefore, the display device of the application can provide a good display effect with low production costs.

BRIEF DESCRIPTION OF THE DRAWINGS

In order to more clearly illustrate the technical proposals in embodiments of the present application, accompanying drawings that are used in the description of the embodiments or exemplary technologies are briefly introduced hereinbelow. Obviously, the drawings in the following description are merely some embodiments of the present application. For those skilled in the art, other drawings can also be obtained according to these drawings without any creative effort.

DETAILED DESCRIPTION OF THE EMBODIMENTS

Figure 1:
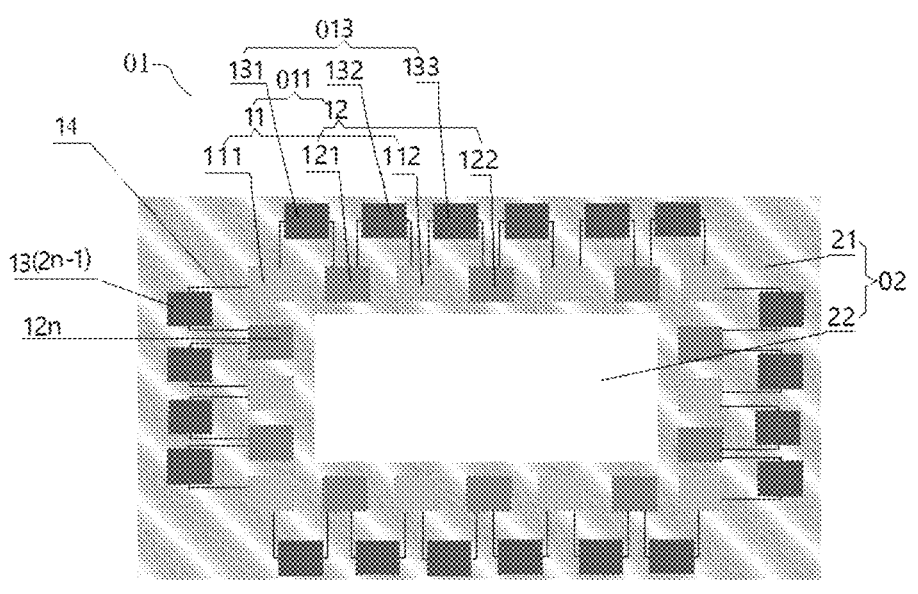
FIG. 1 is a schematic structural diagram of a deformation detection means and a deformable functional layer of a display main body in a display panel according to an embodiment of the present application.

In order to make the purpose, technical proposals, and advantages of the present application more clearly understood, the present application will be described in further detail hereinbelow with reference to the accompanying drawings and embodiments. It should be understood that the specific embodiments described herein are merely used to explain the present application, but not to limit the present application.

In the present application, the term "and/or", which describes the relationship between related objects, means that there can be three relationships, for example, A and/or B, which can represent circumstances that A exists alone, A and B exist at the same time, and B exists alone, where A and B can be singular or plural. The character "/" generally indicates that the associated objects are an "or" relationship.

In this application, "at least one" means one or more, and "a plurality of" means two or more. "At least one item below" or similar expressions refer to any combination of these items, including any combination of single item or plural items. For example, "at least one of a, b, or c" can mean: a, b, c, a-b (i.e., a and b), a-c, b-c, or a-b-c, where a, b, and c can be singular or plural respectively.

It should be understood that, in various embodiments of the present application, the order of the sequential numbers of the above-mentioned processes does not imply the sequence of execution, some or all of the steps may be executed in parallel or sequentially, and the execution sequence of each process should be based on its functions and determined by the internal logic, and should not constitute any limitation on the implementation process of the embodiments of the present application.

The terms used in the embodiments of the present application are merely for the purpose of describing detailed embodiments, and are not intended to limit the present application. As used in the embodiments of this application and the appended claims, the singular forms "a," "said", and "the" are intended to include their plural forms as well, unless the context clearly dictates otherwise.

The weight of the relevant compositions mentioned in the examples of this application can not only refer to the specific content of each composition, but also represent the proportional relationship between the weights of the compositions. It is within the scope disclosed in the embodiments of the present application that the content of the compositions is proportionally scaled up or down. Specifically, the mass described in the description of the embodiments of the present application may be a mass unit known in the chemical field, such as g, mg, g and kg.

The terms "first" and "second" are merely used for descriptive purposes to distinguish objects such as substances from each other, and cannot be understood as indicating or implying relative importance or implying the number of indicated technical features. For example, without departing from the scope of the embodiments of the present application, "the first" may also be referred to as "the second", and similarly, "the second" may also be referred to as "the first". Thus, a feature defined as "first" or "second" may expressly or implicitly include one or more of the features.

A first aspect of the present application provides a display panel, which includes a display main body and a deformation detection means.

The structure of the display main body may have the structure of the existing display main body or an improved structure according to the existing display main body. Regardless of the structure of the display main body in the embodiment of the present application, a display area and an encapsulation area are always included. In one embodiment, the structure of the display main body may be the structure shown in FIG. 6. The display main body 03 includes a lower polarizer 31, an array substrate 32, a metal layer 33, an insulating layer 34, a light-shielding layer 35, a color film substrate 36, and an upper polarizer 37 stacked in sequence. These functional layer structures are disposed in a backlight assembly 39, and a back adhesive layer 38 is disposed between the lower polarizer 31 and a sidewall of the backlight assembly 39, and a frame sealant 310 is provided between the insulating layer 34 and the light-shielding layer 35. These functional layer structures of the display main body 03 are required to be flat during stacking in the encapsulation process. An encapsulation effect as shown in FIG. 7 is required, so as to ensure the encapsulation effect and improve the quality, the display effect, and the service life of the display main body 03. However, in the actual encapsulation process, part of the functional layer structures may be deformed, as shown in FIG. 8. When the functional layers are deformed as shown in FIG. 8. After these functional layer structures are deformed in the manner as shown in FIG. 8, light leakage will occur at the edge of the display main body 03 as shown in FIG. 9 (the amount of liquid crystals at the edge is different from that inside the display area due to deformation, and the light transmittance is thus inconsistent, resulting in light leakage at the edge), which will also lead to a poor sealing effect of the encapsulation of the display main body 03, hence the display effect of the display main body 03 deteriorates and service life thereof also reduces. Deformation as shown in FIGS. 8 and 9 occurring in the encapsulation process of the existing display panel is often impossible to be detected in time, and detection can only be carried out after encapsulation, which directly leads to a decrease in the yield rate and a rise in the repair rate of the display panel after encapsulation.

Figure 6:
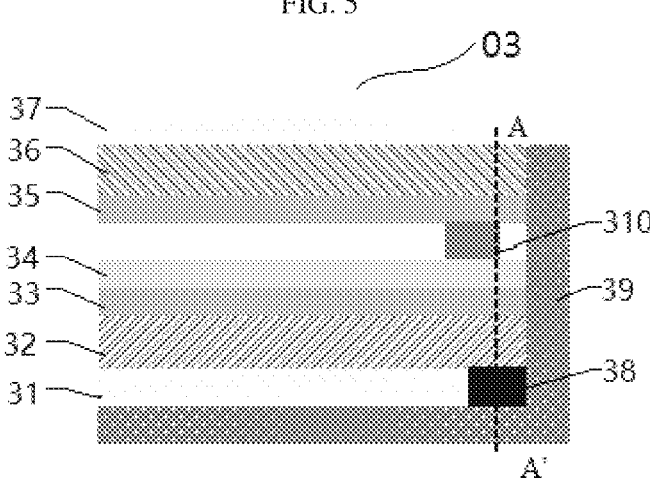
FIG. 6 is a schematic structural diagram of the display main body in the display panel according to an embodiment of the present application.
Figure 7:
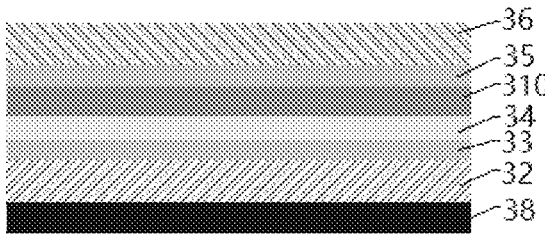
FIG. 7 is a schematic structural diagram of the display main body shown in FIG. 6 when not deformed.
Figure 8:
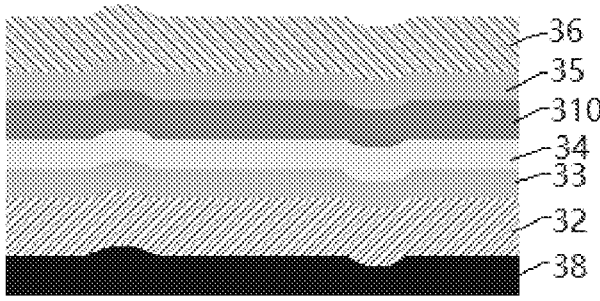
FIG. 8 is a schematic structural diagram of the display main body shown in FIG. 6 when deformed.
Figure 9:
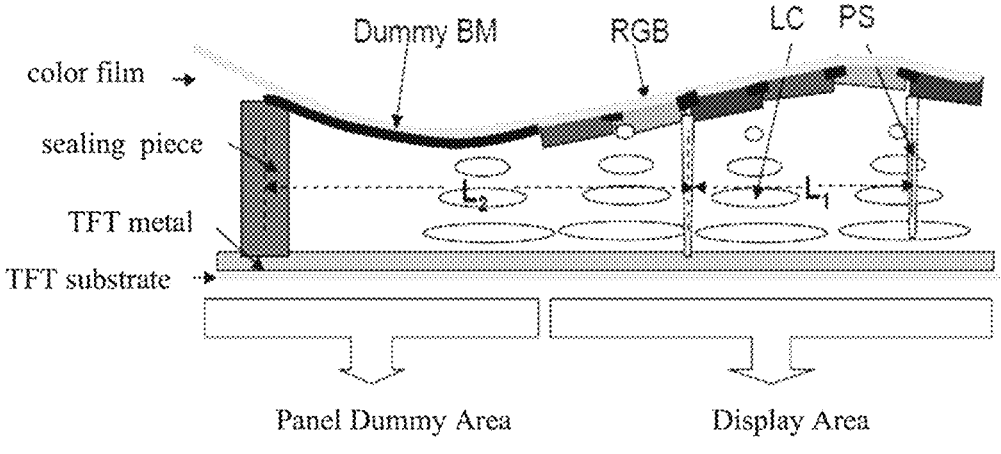
FIG. 9 is a schematic structural diagram showing light leakages resulted from the deformed display main body shown in FIG. 8.

In an embodiment of the present application, in addition to the display main body 03 shown in FIG. 6, the display panel in the embodiment of the present application also includes a deformation detection means (not shown in FIGS. 6 to 9). When a deformation as shown in FIGS. 8 and 9 occurs in the corresponding functional layers of the display main body, the deformation detection means will be triggered to send a signal, so that it can be determined in time whether a deformation occurs in the corresponding functional layers of the display main body during encapsulation. Therefore, the encapsulation process or the conditions thereof can be adjusted, thereby ensuring a high yield rate and the encapsulation quality of the display main body. Moreover, if defects such as light leakage or poor sealing performance is found in the display panel after encapsulation, the cause can be directly determined according to the display results of the deformation detection means, so as to aid the investigation of the reasons for the repair of the display panel and improve the repair efficiency.

The deformation detection means in the display panel of the present application includes an electro-display module and a piezoelectric module. The electro-display module includes more than one electro-display unit, and the electro-display unit is capable of displaying under a voltage applied thereon, so that the detection result is determined according to the display of the electro-display unit, namely the electro-display module.

The piezoelectric module of the deformation detection means is disposed on the surface of at least one deformable functional layer of the above-mentioned display main body, and is located in the encapsulation area of the display main body, which means that the piezoelectric module may be arranged on the surface of one deformable functional layer, or may be arranged on the surfaces of two or more deformable functional layers at the same time. Regardless of whether the piezoelectric module is disposed on the surface of one deformable functional layer or on the surfaces of two or more deformable functional layers at the same time, the piezoelectric module is always disposed on the surface of the deformable functional layer and within the encapsulation area of the display main body. In addition, the deformable functional layer provided with the deformation detection means is hereinafter referred to as a deformable base body, as the base body 02 shown in FIGS. 1-5.

The piezoelectric module includes at least one first piezoelectric unit and at least one second piezoelectric unit, and a voltage difference is applied between the first piezoelectric unit and the second piezoelectric unit. The first piezoelectric unit and the second piezoelectric unit are disposed within the encapsulation area on the deformable base body, spaced apart from each other, and the first piezoelectric unit and the second piezoelectric unit on the surface of the same deformable base body are alternately arranged. Since a voltage difference is applied between the first piezoelectric unit and the second piezoelectric unit, thus the voltage difference is applied between the first piezoelectric unit and the adjacent second piezoelectric unit, and two adjacent piezoelectric units are connected in series through an electro-display unit of the electro-display module located therebetween. Meanwhile, the spacing between the first piezoelectric unit and the second piezoelectric unit is controlled, such that between the first piezoelectric unit and the second piezoelectric unit are in contact with each other when the base body is deformed, which generates a pressure signal that is then converted to an electrical signal. The electrical signal excites the electro-display unit connected in series between the two adjacent piezoelectric units to display.

Since the numbers of the first piezoelectric unit and the second piezoelectric unit are at least two, respectively, that is, there may be more than one, moreover, since an electro-display unit is connected in series between the first piezoelectric unit and each adjacent second piezoelectric unit, therefore, the number of electro-display unit is also at least one, that is, there may be more than one electro-display units. According to the connection between the piezoelectric units and the electro-display unit, if the numbers of the first piezoelectric unit and the second piezoelectric unit are n respectively, then the number of the electro-display unit may be $2n-1$, where n is a positive integer $\geq 2$.

The connection relationship between the electro-display module and the piezoelectric module of the deformation detection means may be as shown in FIG. 1. The deformation detection means 01 includes a piezoelectric module 011 and an electro-display module 013. The piezoelectric module 011 includes a plurality of first piezoelectric units 11 and a plurality of second piezoelectric units 12. For example, the first piezoelectric unit 11 located in the encapsulation area 21 on the surface of the same base body 02 includes a piezoelectric unit 111, a piezoelectric unit 112, . . . . The second piezoelectric unit 12 includes a piezoelectric unit 121, a piezoelectric unit 122, . . . .

Figure 2:
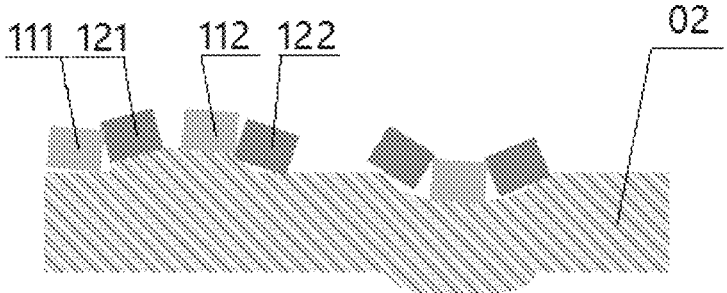
FIG. 2 is a schematic structural diagram showing two adjacent piezoelectric units in a piezoelectric module of the deformation detection means contact each other and generate a pressure signal, when the deformable functional layer of the display main body in the display panel is deformed according to an embodiment of the present application.

When the first piezoelectric unit 11 includes n first piezoelectric units 11, the nth first piezoelectric unit 11 is the piezoelectric unit $11n$. Similarly, when second piezoelectric unit 12 includes n second piezoelectric units 12, the nth second piezoelectric unit 12 is the piezoelectric unit $12n$. The piezoelectric unit 111 is disposed adjacent to the piezoelectric unit 121, the piezoelectric unit 121 is positioned adjacent to the piezoelectric unit 112, the piezoelectric unit 112 is positioned adjacent to the piezoelectric unit 122, and so on. Furthermore, by controlling the spacing between two adjacent piezoelectric units, such as the piezoelectric unit 111 and the piezoelectric unit 121, the piezoelectric unit 121 and the piezoelectric unit 112, the piezoelectric unit 112 and the piezoelectric unit 122, and so on, at least two adjacent piezoelectric units amongst, such as, the piezoelectric unit 111 and the piezoelectric unit 112, and the piezoelectric unit 121 and the piezoelectric unit 122 come into contact with each other and generate a pressure signal when the base body 02 is deformed as shown in FIG. 2. The pressure signal is converted into an electrical signal which excites the electro-display unit connected in series between the two adjacent piezoelectric units to display. In the embodiment, the piezoelectric module 011 includes a plurality of first piezoelectric units 11 and a plurality of second piezoelectric units 12, specifically, such as the piezoelectric unit 111, the piezoelectric unit 112, the piezoelectric unit 121, the piezoelectric unit 122, . . . , and the nth second piezoelectric unit $12n$ which are disposed to surround the display region 22, so as to enhance detection sensitivity of the deformation detection means to a possible deformation of the base body 02 of the display panel.

Meanwhile, as shown in FIG. 1, the electro-display module 013 includes a plurality of electro-display units, such as a first electro-display unit 131, a second electro-display unit 132, a third electro-display unit 133, . . . , when electro-display module 013 includes $2n-1$ electro-display units, the $(2n-1)$th electro-display unit is the $(2n-1)$th electro-display unit 13 $(2n-1)$. The first electro-display unit 131 is connected in series between the piezoelectric unit 111 and the piezoelectric unit 121, the second electro-display unit 132 is connected in series between the piezoelectric unit 121 and the piezoelectric unit 112, and the third electro-display unit 133 is connected in series between the piezoelectric unit 112 and the piezoelectric unit 122, and so on. When at least two adjacent piezoelectric units amongst the piezoelectric unit 111 and the piezoelectric unit 121, the piezoelectric unit 121 and the piezoelectric unit 112, and the piezoelectric unit 112 and the piezoelectric unit 122 contact each other, a pressure signal is generated and converted into an electrical signal, and a corresponding electro-display unit which is connected in series between the two adjacent piezoelectric units, such as at least one of the first electro-display unit 131, the second electro-display unit 132, and the third electro-display unit 133, is excited to display by the electrical signal.

For the piezoelectric units of the piezoelectric module 011, the spacing between two adjacent piezoelectric units, such as, in FIG. 1, the spacing between the piezoelectric unit 111 and the piezoelectric unit 121, the spacing between the piezoelectric unit 121 and the piezoelectric unit 112, and the spacing between the piezoelectric unit 112 and the piezoelectric unit 122, is one of the factors having influence on the detection sensitivity of the deformation detection means 01 of the display panel in the embodiment of the present application. As the spacing between two adjacent piezoelectric units becomes larger, the detection sensitivity of the deformation detection means 01 in the display panel of the embodiment of the present application reduces; and as the spacing between two adjacent piezoelectric units becomes smaller, the detection sensitivity of the deformation detection means 01 in the display panel of the embodiment of the present application increases. In the embodiment, the spacing between two adjacent piezoelectric units is 100-200 μm, such as, but not limited to, 100 μm, 150 μm, and 200 μm. With a spacing within this range, the detection sensitivity of the deformation detection means 01 in the display panel according to the embodiment of the present application, and in particular, the detection of whether the display panel is deformed during the encapsulation process, can be improved effectively.

In an embodiment, the electro-display unit and the two adjacent piezoelectric units may be connected in series by lead wires or by controlling the positions of the electro-display unit and the two adjacent piezoelectric units to realize a series connection via contact. For example, the series connection between the first electro-display unit 131 and the piezoelectric unit 111 and the piezoelectric unit 121, the series connection between the second electro-display unit 132 and the piezoelectric unit 121 and the piezoelectric unit 112, etc., can be realized through a lead wire 14. Obviously, they may also be connected by contact without using a lead wire by controlling the positions of the first electro-display unit 131, the piezoelectric unit 111 and the piezoelectric unit 121.

In addition, the shape of a single piezoelectric unit, such as the piezoelectric unit 111, may be arranged as required. For example, in the embodiment, each single piezoelectric unit is block-like. At this time, a length of the cross section of the single piezoelectric unit parallel to the base body is 100-1000 μm, and a width thereof is 100-500 μm. The shape and size of a single piezoelectric unit may be flexibly set according to the needs of the actual detection environment.

Figure 3:
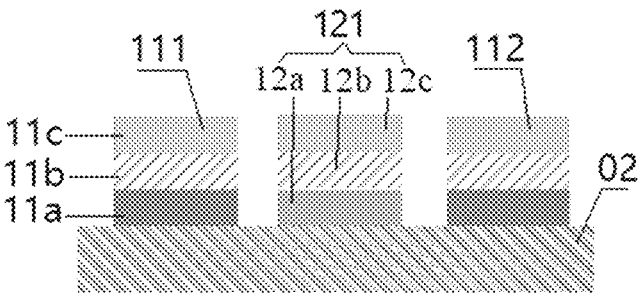
FIG. 3 is a schematic structural diagram showing a structure of the piezoelectric units in the piezoelectric module of the deformation detection means in the display panel according to an embodiment of the present application.
Figure 4:
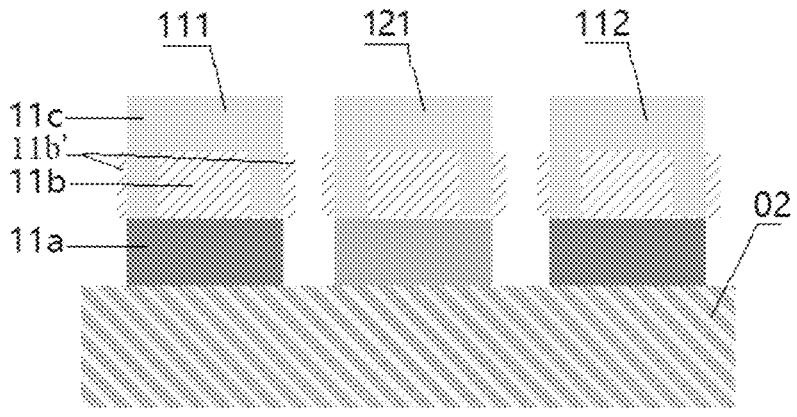
FIG. 4 is a schematic structural diagram showing another structure of the piezoelectric units in the piezoelectric module of the deformation detection means in the display panel according to an embodiment of the present application.
Figure 5:
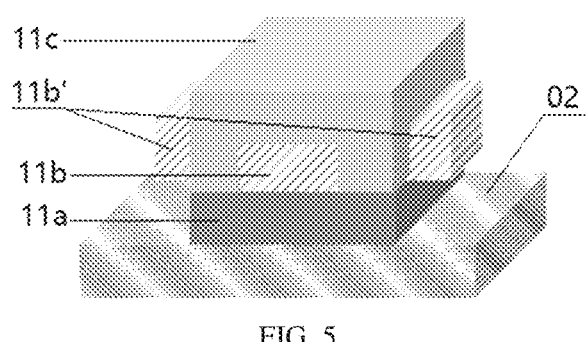
FIG. 5 is a perspective view showing the piezoelectric unit in FIG. 4.

In an embodiment, each piezoelectric unit includes an electrode layer and a piezoelectric layer stacked and combined with the electrode layer, and the electrode layer is disposed on the base body. Specifically, the first piezoelectric unit includes a first electrode layer and a first piezoelectric layer laminated and bonded with the first electrode layer, and the second piezoelectric unit includes a second electrode layer and a second piezoelectric layer laminated and bonded with the second electrode layer. The first electrode layer and the second electrode layer are disposed alternately and spaced apart on the surface of the deformable functional layer. Taking the piezoelectric unit 111 in the first piezoelectric unit 11 and the piezoelectric unit 121 in the second piezoelectric unit 12 shown in FIG. 1 as an example, and as shown in FIGS. 3 to 5, the piezoelectric unit 111 includes a first electrode layer 11*a* and a first piezoelectric layer 11*b* laminated and combined with the first electrode layer 11*a*, and the piezoelectric unit 121 includes a second electrode layer 12*a* and a second piezoelectric layer 12*b* laminated and combined with the second electrode layer 12*a*.

The thickness of the first electrode layer in the first piezoelectric unit, such as the first electrode layer 11*a* in the piezoelectric unit 111 and/or the thickness of the second electrode layer in the second piezoelectric unit, such as the second electrode layer 12*a* in the piezoelectric unit 121, may be 100-500 μm. The thickness of the first piezoelectric layer in the first piezoelectric unit, such as the first piezoelectric layer 11*b* in the piezoelectric unit 111 and/or the thickness of the second piezoelectric layer in the second piezoelectric unit, such as the second piezoelectric layer 12*b* in the piezoelectric unit 121, may be 100-500 μm.

In addition, it should be understood, a voltage difference between the first piezoelectric unit and the second piezoelectric unit of the piezoelectric module in the above-mentioned embodiment is such that, the first piezoelectric unit and an adjacent second piezoelectric unit contact each other thus generate a pressure signal due to the deformation of the base body, and the pressure signal is converted into an electrical signal, which excites the electro-display unit connected in series between the first piezoelectric unit and the adjacent second piezoelectric unit to display. Therefore, in the embodiment, the structure of the first piezoelectric unit and the adjacent second piezoelectric unit with the voltage difference therebetween may be in at least a manner in the following embodiments:

In an embodiment, polarities of the first electrode layer and the second electrode layer are different.

In an embodiment, the polarities of the first electrode layer and the second electrode layer are the same, and the materials of the first piezoelectric layer and the second piezoelectric layer are different.

In an embodiment, the polarities of the first electrode layer and the second electrode layer are the same, and the materials of the first piezoelectric layer and the second piezoelectric layer are the same, while the volumes of the first piezoelectric layer and the second piezoelectric layer are different.

In an embodiment, the polarities of the first electrode layer and the second electrode layer are the same, while the materials and the volumes of the first piezoelectric layer and the second piezoelectric layer are different.

In an embodiment, the polarities of the first electrode layer and the second electrode layer are different, the materials of the first piezoelectric layer and the second piezoelectric layer are different, and the volumes of the first piezoelectric layer and the second piezoelectric layer are different.

In a specific embodiment, the material of the first electrode layer such as the first electrode layer 11*a* and/or the second electrode layer such as the second electrode layer 12*a* may be conventional electrode materials. The difference in the polarities of the first electrode layer and the second electrode layer is realized by controlling the materials and the like of the two electrode layers. The piezoelectric material of the first piezoelectric layer such as the first piezoelectric layer 11*b* and/or the second piezoelectric layer such as the second piezoelectric layer 12*b* independently include one of polyvinylidene fluoride, lead metaniobate, lithium gallate, lithium germanate, titanium germanate, iron transistor lithium niobate, lithium tantalate, and the like. The piezoelectric layer formed by these materials has sensitive piezoelectric properties, and the electrical signal converted by the pressure signal generated by compression is strong, which can effectively excite the electro-display unit for display.

In a further embodiment, each piezoelectric unit also includes an insulating layer laminated and bonded on a surface of the piezoelectric layer facing away from the electrode layer. When the first piezoelectric unit includes an insulating layer, the first piezoelectric unit includes a first insulating layer laminated and bonded on a surface of the first piezoelectric layer facing away from the first electrode layer. When the second piezoelectric unit includes an insulating layer, the second piezoelectric unit includes a second insulating layer laminated and bonded on a surface of the second piezoelectric layer facing away from the second electrode layer. By arranging the insulating layer, the piezoelectric layer is prevented from influence on its piezoelectric sensitivity affected by the contact with other components. Taking the piezoelectric unit 111 of the first piezoelectric unit 11 and the piezoelectric unit 121 of the second piezoelectric unit 12 in FIG. 1 as an example, as shown in FIGS. 3 to 5, the piezoelectric unit 111 further includes a first insulating layer 11*c*, and the first insulating layer 11*c*, the first piezoelectric layer 11*b*, and the first electrode layer 11*a* are laminated in sequence to form a sandwich structure; the piezoelectric unit 121 includes a second insulating layer 12*c*, and the second insulating layer 12*c*, the second piezoelectric layer 12*b*, and the second electrode layer 12*a* are laminated in sequence to form a sandwich structure.

In a further embodiment, at least part of an edge of the insulating layer of each piezoelectric unit extends to contact the electrode layer, and covers the piezoelectric layer. A piezoelectric protrusion is formed by the piezoelectric layer extending out of the insulating layer on a side facing an adjacent piezoelectric unit. The piezoelectric protrusion improves the sensitivity of the generation of a pressure signal by contact of the piezoelectric layers of two adjacent piezoelectric units. By configuring the insulating layer such that at least part of an edge of the insulating layer extends to contact the electrode layer and covers the piezoelectric layer, the piezoelectric layer is protected from contact with other components which may affect the piezoelectric sensitivity of the piezoelectric layer, at the same time, the insulating layer also supports itself in order to avoid forces exerted on the piezoelectric layer from the insulating layer, therefore, it can be ensured that the contact of the piezoelectric layer with a piezoelectric layer of the adjacent piezoelectric unit is only caused by the deformation of the base body, hence the pressure signal generated by the piezoelectric layer is only related to the deformation of the base body. In a specific embodiment, four corners of the insulating layer extend, covering four corners of the piezoelectric layer, to the electrode layer when the piezoelectric unit is in a block-like shape. For example, a length and width of the insulating layer that is in the same layer with the piezoelectric layer may be respectively, but not limited to, $\frac{1}{10}$ and $\frac{1}{5}$ of those of the piezoelectric layer.

In an embodiment, the thickness of the insulating layer is 100-500 μm. The material of the insulating layer may be at least one of silicon oxide, indium tin oxide, polyethylene, and epoxy resin. The above-mentioned effect can be achieved by controlling the thickness and material of the insulating layer.

As shown in FIGS. 4 and 5, specifically, taking the piezoelectric unit 111 of the first piezoelectric unit 11 in FIG. 1 as an example, at least part of an edge of the first insulating layer 11c of the piezoelectric unit 111 extends to contact the first electrode layer 11a, and covers the first piezoelectric layer 11b. A piezoelectric protrusion 11b' is formed by the first piezoelectric layer 11b extending outside of the first insulating layer 11c on a side facing the adjacent piezoelectric unit 112. In a specific embodiment, when the piezoelectric unit 111 is in a block-like shape, four corners of the first insulating layer 11c extends, covering four corners of the first piezoelectric layer 11b, until contacts the first electrode layer 11a, and a piezoelectric protrusion 11b' is formed by the first piezoelectric layer 11b extending outside of the first insulating layer 11c on each of two sides facing the adjacent piezoelectric units. The first insulating layer 11c in FIGS. 4 and 5 also supports itself in order to avoid forces exerted on the first piezoelectric layer 11b from the first insulating layer 11c. Therefore, it can be ensured that the contact of the first piezoelectric layer 11b with, such as, the second piezoelectric layer of the piezoelectric unit 121 of the second electric unit 12 is only caused by the deformation of the base body 02, hence the pressure signal generated by the piezoelectric unit 111 and the piezoelectric unit 112 is only related to the deformation of the base body 02. The piezoelectric protrusion 11b' improves the sensitivity of the generation of a pressure signal by contact of the piezoelectric layers of the piezoelectric unit 111 and the piezoelectric unit 112. Therefore, the proposal shown in FIGS. 4 and 5 is an improvement based on the proposal in FIG. 3.

In an embodiment, the length of the piezoelectric protrusion such as the piezoelectric protrusion 11b' shown in FIGS. 4 and 5 is 100-250 μm, and specifically may be 200 μm. The sensitivity of the piezoelectric module 11 can be improved by adjusting the piezoelectric protrusion.

For the ease of observation, the position of the above-mentioned electro-display unit in the electro-display module of the deformation detection means may be arranged as required. For example, the electro-display unit may be positioned on the base body as the piezoelectric module. Specifically, the electro-display unit and the piezoelectric module may be position on the same base body, or on different base bodies, based on the observation and encapsulation of the display main body. In a specific embodiment as shown in FIG. 1, the electro-display unit 013 is positioned on the surface of the same deformable base body 02 with the first piezoelectric unit 11. Specifically, for example, the first electro-display unit 131 of the electro-display unit 013 is positioned on the base body 02 near the piezoelectric unit 111 and the piezoelectric unit 121. The second electro-display unit 132 is positioned on the base body 02 near the piezoelectric unit 121 and the piezoelectric unit 112, and the electro-display unit 013 and the piezoelectric units such as the first piezoelectric unit 11 are all located in the non-display region 21 of the base body 02, namely, the non-display region of the display main body.

In an embodiment, the electro-display unit such as the first electro-display unit 131 and the second electro-display unit 132 includes an electrochromic unit and/or an electroluminescent unit. When the electro-display unit is an electrochromic unit, the electrochromic unit includes an electrochromic material layer, which is electrically connected to the electrode layers in the adjacent piezoelectric units. In a specific embodiment, the electrochromic material of the electrochromic material layer includes at least one of tungsten trioxide, polythiophenes, polythiophene derivatives, viologens, tetrathiafulvalenes, and metal phthalocyanine compounds. Taking the piezoelectric unit 111 of the first piezoelectric unit 11, the piezoelectric unit 121 of the second piezoelectric unit 12, and the electro-display unit 131 in FIG. 1 as an example, the first electrode layer 11a of the piezoelectric unit 111 and the second electrode layer 12a of the piezoelectric unit 121 are respectively connected in series between the electrochromic material layer of the electro-display unit 131.

When the electro-display unit is an electroluminescent unit, the electroluminescent unit includes an electroluminescent material layer, which is electrically connected to the electrode layers in the adjacent piezoelectric units. The specific arrangement of the connection between the electroluminescent material layer and the electrode layers in the adjacent piezoelectric units are the same with that between the electrochromic material layer and the electrode layers in the adjacent piezoelectric units. In a specific embodiment, as an improved embodiment of the electroluminescent material layer, the electroluminescent unit includes an electrode I, a luminescent functional layer, and an electrode II, which are laminated in sequence forming a sandwich structure. The electrode I is electrically connected with the electrode layer of one of the two adjacent piezoelectric units, and the electrode II is electrically connected with the electrode layer of the other one of the two adjacent piezoelectric units. Taking the piezoelectric unit 111 of the first piezoelectric unit 11, the piezoelectric unit 121 of the second piezoelectric unit 12, and the electro-display unit 131 in FIG. 1 as an example, the electrode I of the first electro-display unit 131 is electrically connected with the first electrode layer 11a of the piezoelectric unit 111, and the electrode II is electrically connected with the second electrode layer 12a of the piezoelectric unit 121.

In a specific embodiment, the electroluminescent material of the luminescent functional layer includes at least one of the of zinc sulfide, strontium sulfide or calcium sulfide.

The above-mentioned electro-display units may change color or luminesce under the electrical signal converted from the pressure signal generated by the contact between two adjacent piezoelectric units, thereby allowing observation and determination of deformation in the encapsulation area of the display main body.

In addition, the deformable base body, such as the base body 02 as shown in FIGS. 1 to 5, is a deformable functional layer in the display main body, such as a color film substrate. Therefore, the piezoelectric module of deformation detection means should be positioned in the encapsulation area of the display main body. Ideally, the piezoelectric module and the electro-display module of deformation detection means are both positioned in the encapsulation area of the display main body, and surround the display region, as shown in FIG. 1. In a specific embodiment, the piezoelectric module and the electro-display module, such as the piezoelectric module 011 and the electro-display module 013 in FIGS. 1 to 5, may be fixedly positioned in the encapsulation area on the surface of the base body 02, namely the deformable functional layer of the display main body, specifically, in the encapsulation area on the surface of the color film substrate. The piezoelectric module 011 and the electro-display module 013 may also be detachably positioned in the encapsulation area on the surface of the base body 02, namely the deformable functional layer of the display main body. The piezoelectric unit of the piezoelectric module 011 is fixedly or detachably positioned in the encapsulation area on the surface of the base body 02, namely the deformable functional layer of the display main body, through the electrode layer thereof. In an embodiment, the above-mentioned piezoelectric units surround the display region of the display panel of the embodiment of the present application, so as to improve the detection sensitivity of the deformation detection means to the possible deformation.

Therefore, the display panel in the embodiment of the present application has the deformation detection means in the encapsulation area of the deformation detection layer, through the cooperation of the piezoelectric module and the electro-display module of the deformation detection means, deformation of the deformable functional layer can be determined directly according to the display of the electro-display module. The display main body can be adjusted or controlled timely in the encapsulation process, so that the yield rate and the quality of the display panel can be improved. The sensitivity and reliability of the deformation detection means of the display panel in the embodiment of the present application can be enhanced by adjusting the spacing between the piezoelectric units of the piezoelectric module, thereby further improving the encapsulation quality and display effect of the display panel.

Accordingly, an embodiment of the present application further provides an encapsulation method for the above-mentioned display panel. The method includes the following steps:

S01: arranging a piezoelectric module on a surface of at least one deformable functional layer in a display main body, such that the piezoelectric module is positioned in an encapsulation area on the deformable functional layer; where the piezoelectric module includes at least one first piezoelectric unit and at least one second piezoelectric unit, and a voltage difference being applied between the first piezoelectric unit and the second piezoelectric unit; the first piezoelectric unit and the second piezoelectric unit are alternately disposed on the surface of the same deformable functional layer and spaced apart from each other; and the spacing between the first piezoelectric unit and the adjacent second piezoelectric unit is such that when the deformable functional layer is deformed, the first piezoelectric unit and the adjacent second piezoelectric unit is able to contact each other to generate a pressure signal which is converted into an electrical signal;

S02: connecting an electro-display unit in series between two adjacent piezoelectric units for display under excitation of an electrical signal; and S03: carrying out encapsulation process for the deformable functional layer having the piezoelectric module arranged thereon and other functional parts in the display main body, monitoring a display result of the electro-display unit, and adjusting encapsulation conditions according to the display result.

The display main body in step S01 is the display main body of the display panel according to the above-mentioned embodiments of the present application, thus the deformable functional layer of the display main body is the deformable functional layer of the display main body of the display panel according to the above-mentioned embodiments of the present application, namely the deformable base body, such as the base body 02 in FIGS. 1 to 5 as defined above.

The piezoelectric module and the piezoelectric units thereof in S01 are the piezoelectric module and the piezoelectric units in the deformation detection means of the display panel in the above-mentioned embodiments of the present application. The piezoelectric units are arranged on the deformable functional layer in the manner as the arrangement of the piezoelectric units of the deformation detection means described in the above embodiments.

Furthermore, the stricture of the piezoelectric units is the same as the structure of the piezoelectric units of the above-mentioned deformation detection means, specifically, as the structure shown in FIGS. 4 and 5.

Therefore, the method of arranging a piezoelectric module in the encapsulation area on the surface of the deformable functional layer includes the following steps:

S011: disposing at least one first electrode layer and at least one second electrode layer at intervals in the encapsulation area on the surface of the deformable functional layer; and S012: forming a first piezoelectric layer laminated and bonded with the first electrode layer, where the first piezoelectric layer and the first electrode layer form the first piezoelectric unit; forming a second piezoelectric layer laminated and bonded with the second electrode layer, where the second piezoelectric layer and the second electrode layer form the second piezoelectric unit; and arranging the first piezoelectric layer and the adjacent second piezoelectric layer such that they contact each other when the deformable functional layer is deformed to generate a pressure signal.

The method of forming the electrode layer, such as the first electrode layer and the second electrode layer, in step S011, may be flexibly selected according to the characteristics of the electrode material, such as evaporation, coating, or direct bonding. In the formed electrode layer, the spacing between the first electrode layer and the adjacent second electrode layer is the same as that between the first piezoelectric unit and the adjacent second piezoelectric unit of the deformation detection means in the display panel of the above-mentioned embodiment. The thicknesses of the electrode layer such as the first electrode layer and the second electrode layer are also the same as that mentioned above.

The method of forming the piezoelectric layer, such as the first piezoelectric layer and the second piezoelectric layer, in step S012 may be flexibly selected according to the characteristics of the piezoelectric material. The material, thickness and morphology of the formed piezoelectric layer are also the same as those of the piezoelectric layer such as the first piezoelectric layer and the second piezoelectric layer of the deformation detection means in the display panel in the above-mentioned embodiments.

In a further embodiment, when the piezoelectric unit further includes an insulating layer as shown in FIGS. 3 to 5, a step S013 of forming the insulating layer is further included as follows:

forming a first insulating layer covering the first piezoelectric layer on a surface of the first piezoelectric layer; and/or forming a second insulating layer covering the second piezoelectric layer on a surface of the second piezoelectric layer.

The method of forming the insulating layer such as the first insulating layer and the second insulating layer in step S013 may also be flexibly selected according to the characteristics of the insulating material, such as spraying, scraping, and the like. The material, thickness and morphology of the formed insulating layer are also the same as those of the insulating layer of the deformation detection means of the display panel in the above-mentioned embodiments.

The electro-display unit in step S02 is the same as the electro-display unit of the deformation detection means in the display panel of the above-mentioned embodiment, and an electro-display module is formed by a plurality of electro-display units. In a specific embodiment, the arrangement of the electro-display unit and the series connection with the two adjacent piezoelectric units are also the same as the arrangement of the electro-display unit and the series connection with the two adjacent piezoelectric units of the deformation detection means in the display panel provided in the above-mentioned embodiment.

During the encapsulation process in step S03, since a deformation detection means is formed in the encapsulation area on the surface of at least one deformable functional layer based on the processes in steps S01 and S02, therefore, if the morphology of the functional layers in the display main body remains stable in the encapsulation process, namely the electro-display module of the deformation detection means is not excited by deformation to display, then the encapsulation effect of the encapsulation process is good; if the electro-display module of the deformation detection means is excited to display, then adjustment is needed for the conditions of the encapsulation process, which may lead to light leakage and poor sealing performance in the display main body after encapsulation.

Therefore, in the embodiment, the method for adjusting the conditions of the encapsulation process according to the display result in step S03 includes the following steps:

S031: optimizing the conditions of the encapsulation process when the electro-display unit emits light or changes color, until the electro-display unit stops changing color or emitting light;

S032: keeping the conditions of the encapsulation process unchanged when the electro-display unit does not emit light or change color.

Therefore, in the encapsulation method for the display panel of the embodiment of the present application, a plurality of piezoelectric units are effectively arranged at intervals on the deformable functional layer, and the electro-display unit is connected in series between two adjacent piezoelectric units, so that the deformation detection means of the display panel of the above-mentioned embodiment is formed. Therefore, the display panel can be detected and monitored in real time whether undesirable phenomena, such as deformation occurs in the display panel during the encapsulation process, preventing light leakage after the encapsulation process. Thus, the encapsulation quality of the display panel can be guaranteed, the yield rate and encapsulation quality of the display panel can be enhanced, and the display effect of the display panel can be improved, at the same time, the repair rate of the display panel can be reduced, and the encapsulation cost can be lowered.

A third aspect of the present application also provides a display device. The display device of the embodiment of the present application includes necessary components such as the display panel of the above-mentioned embodiment of the present application, that is, the display panel of the display device in the embodiment of the present application includes the deformation detection means described above. Therefore, the display panel of the display device according to the embodiment of the present application has high encapsulation quality, good display effect and sealing effect, as well as long service life and low cost.

The above are merely optional embodiments of the present application, and are not intended to limit the present application. Any modification, equivalent replacement, and improvement made within the spirit and principle of the present application shall fall within the scope of protection of the present application.

What is claimed is:

1. A display panel, comprising a display main body, the display main body comprising a display area and an encapsulation area, wherein the display panel further comprises a deformation detection means, the deformation detection means comprises:

an electro-display module comprising one or more electro-display units; and a piezoelectric module positioned on a surface of at least one deformable functional layer in the display main body and positioned in the encapsulation area;

wherein the piezoelectric module comprises at least one first piezoelectric unit and at least one second piezoelectric unit, and a voltage difference is applied between the first piezoelectric unit and the second piezoelectric unit;

and wherein the first piezoelectric unit and the second piezoelectric unit disposed on the surface of a same deformable functional layer are alternated and spaced apart from each other, two adjacent piezoelectric units are connected in series by an electro-display unit therebetween, and a spacing between the two adjacent piezoelectric units is such that when the deformable functional layer is deformed, the two adjacent piezoelectric units contact each other to generate a pressure signal which is converted into an electrical signal, and the electrical signal excites the electro-display unit that is connected in series between the first piezoelectric unit and the second piezoelectric unit to display.

2. The display panel according to claim 1, wherein the first piezoelectric unit comprises a first electrode layer and a first piezoelectric layer laminated and bonded with the first electrode layer, the second piezoelectric unit comprises a second electrode layer and a second piezoelectric layer laminated and bonded with the second electrode layer, and the first electrode layer and the second electrode layer are disposed alternately and spaced apart on the surface of the deformable functional layer, when the deformable functional layer is deformed, the two adjacent piezoelectric units contact each other to generate the pressure signal which is converted into the electrical signal; and/or each of the electro-display units comprises an electrochromic unit and/or an electroluminescent unit; and/or the electro-display units and the first and second piezoelectric units are disposed on the surface of the same deformable functional layer, and the electro-display units are located in a non-display area of the display main body; and/or the deformable functional layer comprises a color film substrate; and/or the first and second piezoelectric units are disposed surrounding the display area.

3. The display panel according to claim 2, wherein the spacing between the first piezoelectric unit and the second piezoelectric unit adjacent with each other is 100-200 μm; and/or the first piezoelectric unit and/or the second piezoelectric unit is in a block-like shape, a length of a cross section of the first piezoelectric unit and/or the second piezoelectric unit parallel to the deformable functional layer is 100-1000 μm, and a width is 100-500 μm; and/or a thickness of the first electrode layer and/or the second electrode layer is 100-500 μm; and/or a thickness of the first piezoelectric layer and/or the second piezoelectric layer is 100-500 μm; and/or a piezoelectric material of the first piezoelectric layer and/or the second piezoelectric layer independently comprises one of polyvinylidene fluoride, lead metaniobate, lithium gallate, lithium germanate, titanium germanate, iron transistor lithium niobate, and lithium tantalate; and/or the first piezoelectric unit comprises a first insulating layer laminated and bonded on a surface of the first piezoelectric layer facing away from the first electrode layer; and/or the second piezoelectric unit comprises a second insulating layer laminated and bonded on a surface of the second piezoelectric layer facing away from the second electrode layer.

4. The display panel according to claim 3, wherein at least part of an edge of the first insulating layer extends to contact the first electrode layer and covers the first piezoelectric layer, and a first piezoelectric protrusion is formed by the first piezoelectric layer extending out of the first insulating layer on a side facing an adjacent piezoelectric unit; and/or at least part of an edge of the second insulating layer extends to contact the second electrode layer, and covers the second piezoelectric layer, and a second piezoelectric protrusion is formed by the second piezoelectric layer extending out of the second insulating layer on a side facing an adjacent piezoelectric unit; and/or a material of the first insulating layer and/or the second insulating layer independently comprises at least one of silicon oxide, indium tin oxide, polyethylene, and epoxy resin; and/or a thickness of the first insulating layer and/or the second insulating layer is 100-500 □m.

5. The display panel according to claim 4, wherein a length of the first piezoelectric protrusion and/or the second piezoelectric protrusion is 100-250 μm; and/or the first piezoelectric unit is in the block-like shape, and four corners of the first insulating layer extend, covering four corners of the first piezoelectric layer, until contact the first electrode layer; and/or the second piezoelectric unit is in the block-like shape, and four corners of the second insulating layer extend, covering four corners of the second piezoelectric layer, until contact the second electrode layer.

6. The display panel according to claim 2, wherein polarities of the first electrode layer and the second electrode layer are different; or the polarities of the first electrode layer and the second electrode layer are the same, and materials of the first piezoelectric layer and the second piezoelectric layer are different; or the polarities of the first electrode layer and the second electrode layer are the same, and the materials of the first piezoelectric layer and the second piezoelectric layer are the same, while volumes of the first piezoelectric layer and the second piezoelectric layer are different; or the polarities of the first electrode layer and the second electrode layer are the same, while the materials and the volumes of the first piezoelectric layer and the second piezoelectric layer are different; or the polarities of the first electrode layer and the second electrode layer are different, the materials of the first piezoelectric layer and the second piezoelectric layer are different, and the volumes of the first piezoelectric layer and the second piezoelectric layer are different.

7. The display panel according to claim 3, wherein polarities of the first electrode layer and the second electrode layer are different; or the polarities of the first electrode layer and the second electrode layer are the same, and materials of the first piezoelectric layer and the second piezoelectric layer are different; or the polarities of the first electrode layer and the second electrode layer are the same, and the materials of the first piezoelectric layer and the second piezoelectric layer are the same, while volumes of the first piezoelectric layer and the second piezoelectric layer are different; or the polarities of the first electrode layer and the second electrode layer are the same, while the materials and the volumes of the first piezoelectric layer and the second piezoelectric layer are different; or the polarities of the first electrode layer and the second electrode layer are different, the materials of the first piezoelectric layer and the second piezoelectric layer are different, and the volumes of the first piezoelectric layer and the second piezoelectric layer are different.

8. The display panel according to claim 4, wherein polarities of the first electrode layer and the second electrode layer are different; or the polarities of the first electrode layer and the second electrode layer are the same, and materials of the first piezoelectric layer and the second piezoelectric layer are different; or the polarities of the first electrode layer and the second electrode layer are the same, and the materials of the first piezoelectric layer and the second piezoelectric layer are the same, while volumes of the first piezoelectric layer and the second piezoelectric layer are different; or the polarities of the first electrode layer and the second electrode layer are the same, while the materials and the volumes of the first piezoelectric layer and the second piezoelectric layer are different; or the polarities of the first electrode layer and the second electrode layer are different, the materials of the first piezoelectric layer and the second piezoelectric layer are different, and the volumes of the first piezoelectric layer and the second piezoelectric layer are different.

9. The display panel according to claim 5, wherein polarities of the first electrode layer and the second electrode layer are different; or the polarities of the first electrode layer and the second electrode layer are the same, and materials of the first piezoelectric layer and the second piezoelectric layer are different; or the polarities of the first electrode layer and the second electrode layer are the same, and the materials of the first piezoelectric layer and the second piezoelectric layer are the same, while volumes of the first piezoelectric layer and the second piezoelectric layer are different; or the polarities of the first electrode layer and the second electrode layer are the same, while the materials and the volumes of the first piezoelectric layer and the second piezoelectric layer are different; or the polarities of the first electrode layer and the second electrode layer are different, the materials of the first piezoelectric layer and the second piezoelectric layer are different, and the volumes of the first piezoelectric layer and the second piezoelectric layer are different.

10. The display panel according to claim 2, wherein the electrochromic unit is an electrochromic material layer which is connected in series between electrode layers of the two adjacent piezoelectric units; and the electroluminescent unit is an electroluminescent material layer, which is connected in series between the electrode layers of the two adjacent piezoelectric units.

11. The display panel according to claim 3, wherein the electrochromic unit is an electrochromic material layer which is connected in series between electrode layers of the two adjacent piezoelectric units; and the electroluminescent unit is an electroluminescent material layer, which is connected in series between the electrode layers of the two adjacent piezoelectric units.

12. The display panel according to claim 4, wherein the electrochromic unit is an electrochromic material layer which is connected in series between electrode layers of the two adjacent piezoelectric units; and the electroluminescent unit is an electroluminescent material layer, which is connected in series between the electrode layers of the two adjacent piezoelectric units.

13. The display panel according to claim 5, wherein the electrochromic unit is an electrochromic material layer which is connected in series between electrode layers of the two adjacent piezoelectric units; and the electroluminescent unit is an electroluminescent material layer, which is connected in series between the electrode layers of the two adjacent piezoelectric units.

14. A display device, comprising the display panel according to claim 1.

15. The display device according to claim 14, wherein the first piezoelectric unit comprises a first electrode layer and a first piezoelectric layer laminated and bonded with the first electrode layer, the second piezoelectric unit comprises a second electrode layer and a second piezoelectric layer laminated and bonded with the second electrode layer, and the first electrode layer and the second electrode layer are disposed alternately and spaced apart on the surface of the deformable functional layer; and/or each of the electro-display units comprises an electrochromic unit and/or an electroluminescent unit; and/or the electro-display units and the first and second piezoelectric units are disposed on the surface of the same deformable functional layer, and the electro-display units are located in a non-display area of the display main body; and/or the deformable functional layer comprises a color film substrate; and/or the first and second piezoelectric units are disposed surrounding the display area.

16. The display device according to claim 15, wherein the spacing between the first piezoelectric unit and the second piezoelectric unit adjacent with each other is 100-200 μm; and/or the first piezoelectric unit and/or the second piezoelectric unit is in a block-like shape, a length of a cross section of the first piezoelectric unit and/or the second piezoelectric unit parallel to the deformable functional layer is 100-1000 μm, and a width is 100-500 μm; and/or a thickness of the first electrode layer and/or the second electrode layer is 100-500 μm; and/or a thickness of the first piezoelectric layer and/or the second piezoelectric layer is 100-500 μm; and/or a piezoelectric material of the first piezoelectric layer and/or the second piezoelectric layer independently comprises one of polyvinylidene fluoride, lead metaniobate, lithium gallate, lithium germanate, titanium germanate, iron transistor lithium niobate, and lithium tantalate; and/or the first piezoelectric unit comprises a first insulating layer laminated and bonded on a surface of the first piezoelectric layer facing away from the first electrode layer; and/or the second piezoelectric unit comprises a second insulating layer laminated and bonded on a surface of the second piezoelectric layer facing away from the second electrode layer.

17. The display device according to claim 16, wherein at least part of an edge of the first insulating layer extends to contact the first electrode layer, and covers the first piezoelectric layer, and a first piezoelectric protrusion is formed by the first piezoelectric layer extending out of the first insulating layer on a side facing an adjacent piezoelectric unit; and/or at least part of an edge of the second insulating layer extends to contact the second electrode layer, and covers the second piezoelectric layer, and a second piezoelectric protrusion is formed by the second piezoelectric layer extending out of the second insulating layer on a side facing an adjacent piezoelectric unit; and/or a material of the first insulating layer and/or the second insulating layer independently comprises at least one of silicon oxide, indium tin oxide, polyethylene, and epoxy resin; and/or a thickness of the first insulating layer and/or the second insulating layer is 100-500 μm.

* * * * *